(12) United States Patent
Shinohara

(10) Patent No.: US 8,933,690 B2
(45) Date of Patent: Jan. 13, 2015

(54) ANGLE DETECTION APPARATUS

(75) Inventor: Makoto Shinohara, Kanagawa-ken (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 348 days.

(21) Appl. No.: 13/234,022

(22) Filed: Sep. 15, 2011

(65) Prior Publication Data

US 2012/0187939 A1 Jul. 26, 2012

(30) Foreign Application Priority Data

Jan. 25, 2011 (JP) ................... 2011-012954

(51) Int. Cl.
*G01B 7/14* (2006.01)
*G01B 7/30* (2006.01)
*G01R 33/07* (2006.01)

(52) U.S. Cl.
CPC ............... *G01R 33/072* (2013.01); *G01B 7/30* (2013.01)
USPC .................. 324/207.2; 324/202; 324/207.25; 324/207.12

(58) Field of Classification Search
USPC ...................... 324/207.2, 207.25, 202, 207.12
See application file for complete search history.

(56) References Cited

U.S. PATENT DOCUMENTS

2011/0090104 A1 4/2011 Sata et al.

FOREIGN PATENT DOCUMENTS

| JP | 2009-276261 | 11/2009 |
| JP | 2010-078340 A | 4/2010 |

OTHER PUBLICATIONS

Japanese Office Action issued Dec. 4, 2013 in corresponding JP Application No. 2011-012954, along with English translation thereof.
Japanese Office Action issued on May 30, 2014 in corresponding Japanese Application No. 2011-012954, along with English translation.

*Primary Examiner* — Reena Aurora
(74) *Attorney, Agent, or Firm* — White & Case LLP

(57) ABSTRACT

According to an embodiment of the invention, an angle detection apparatus detects the angle of a rotation axis of a rotating device to generate a first signal and a second signal perpendicular to the first signal using the angle detection unit. The first AD conversion unit receives the first signal to perform an analog-to-digital conversion of the first signal. The second AD conversion unit receives the second signal to perform an analog-to-digital conversion of the second signal. The first offset correction unit receives a third signal output from the first AD conversion unit to perform an offset correction of the third signal when the third signal is outside a predetermined range. The second offset correction unit receives a fourth signal output from the second AD conversion unit to perform an offset correction of the fourth signal when the fourth signal is outside the predetermined range.

16 Claims, 6 Drawing Sheets

ANGLE DETECTION APPARATUS

CROSS REFERENCE TO RELATED APPLICATION

This application is based upon and claims the benefit of priority from the prior Japanese Patent Application No. 2011-012954, filed on Jan. 25, 2011, the entire contents of which are incorporated herein by reference.

FIELD

Embodiments described herein relate to an angle detection apparatus.

BACKGROUND

In an angle detection apparatus for a rotation axis of a motor or the like, an amplitude-modulated signal of an excitation signal output from a resolver in accordance with a rotation angle is frequently used. In the angle detection apparatus using the resolver, the resolver is relatively expensive and the excitation signal is needed. Thus, an angle detection apparatus using an angle detection sensor, such as a Hall sensor, that is relatively inexpensive and does not need any excitation signal is beginning to be used more frequently.

In an angle detection apparatus, there is a problem that the angle accuracy is reduced when an offset is contained in an input. In addition, the angle detection apparatus using the resolver alone or the angle detection apparatus using the angle detection sensor alone cannot be applied to various uses. Accordingly, an angle detection apparatus capable of appropriately using either a resolver or an angle detection sensor depending on the use has been desired.

DETAILED DESCRIPTION

Figure 1:
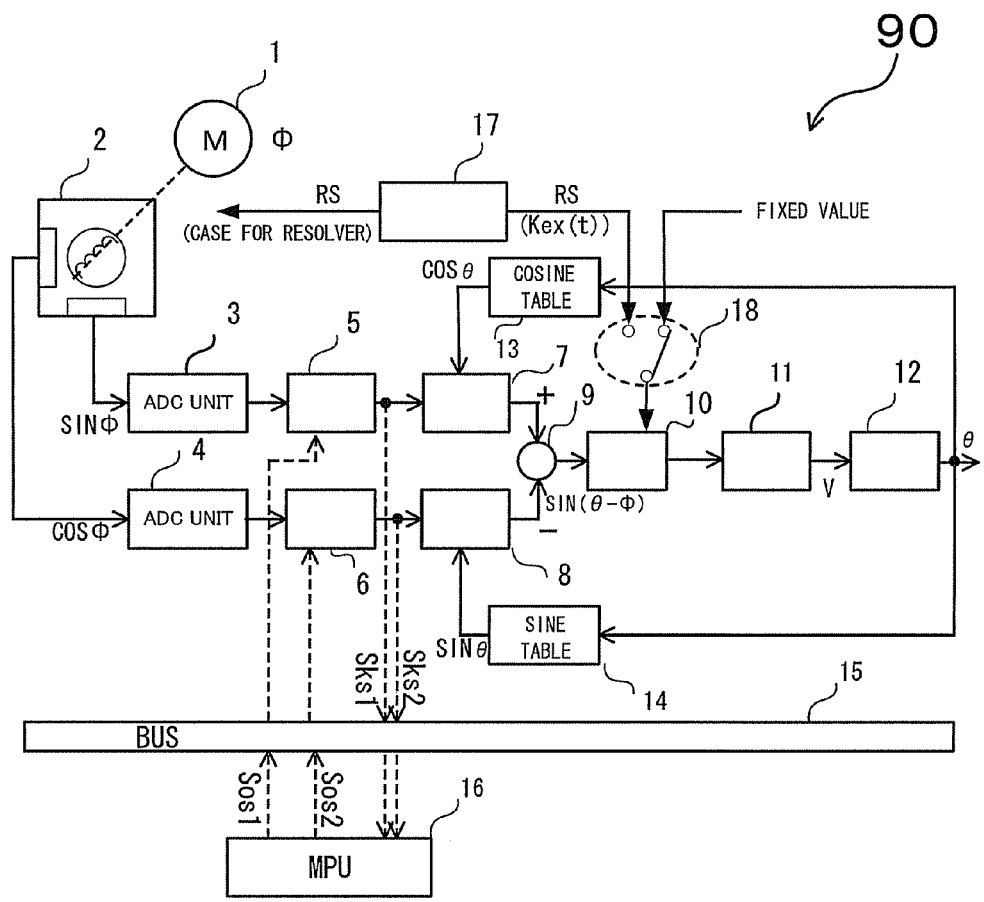
FIG. 1 is a block diagram showing an angle detection apparatus according to a first embodiment.

According to an embodiment of the invention, an angle detection apparatus detects the angle of a rotation axis of a rotating device to generate a first signal and a second signal perpendicular to the first signal using an angle detection unit. The first AD conversion unit receives the first signal to perform an analog-to-digital conversion of the first signal. The second AD conversion unit receives the second signal to perform an analog-to-digital conversion of the second signal. The first offset correction unit receives a third signal output from the first AD conversion unit to perform an offset correction of the third signal when the third signal is outside a predetermined range. The second offset correction unit receives a fourth signal output from the second AD conversion unit to perform an offset correction of the fourth signal when the fourth signal is outside the predetermined range.

Further, a plurality of embodiments will be described below with reference to drawings. The same reference numerals in the drawings indicate the same portions or similar portions.

Figure 2:
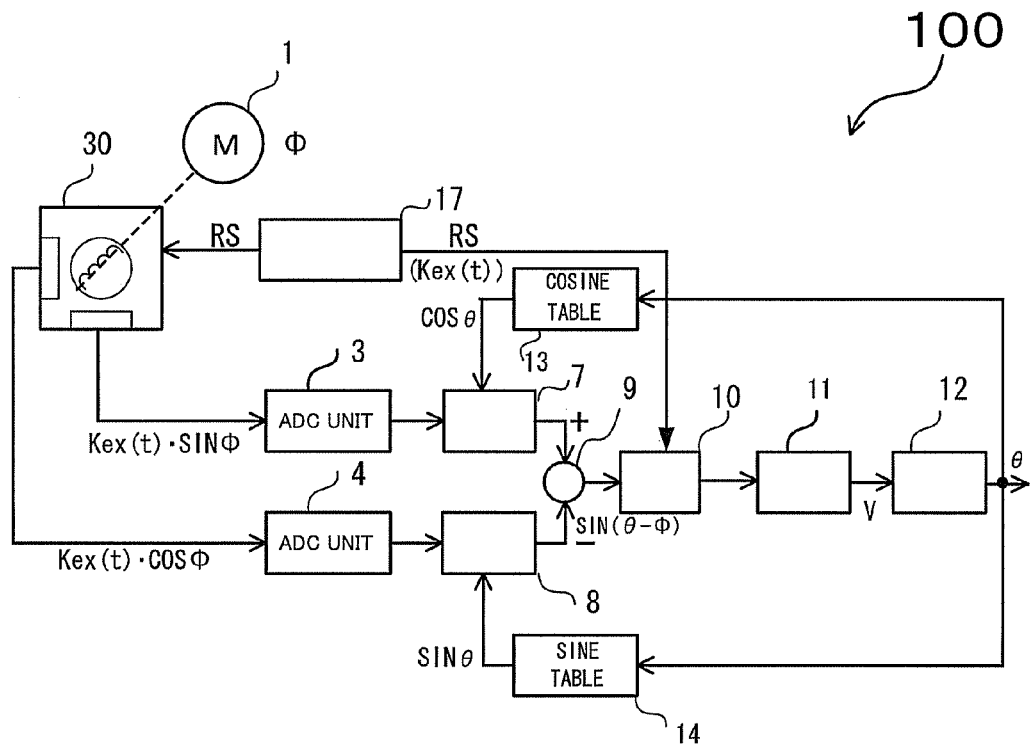
FIG. 2 is a block diagram showing the angle detection apparatus of a comparative example according to the first embodiment.

An angle detection apparatus according to a first embodiment will be described with reference to the drawings. FIG. 1 is a block diagram showing the angle detection apparatus. FIG. 2 is a block diagram showing the angle detection apparatus of a comparative example. In the embodiment, the angle of a rotation axis of a motor is detected and an offset correction is performed by an offset correction unit provided on the output side of an AD conversion unit.

In an angle detection apparatus 90, when a Hall sensor 2 is used as an angle detection unit for angle detection of the rotation axis of a motor 1 serving as a rotating device, a fixed value is input into a detection unit 10 by a switch 18. For the Hall sensor 2, an excitation signal RS is not needed. When a resolver is used as an angle detection unit for the angle detection of the rotation axis of the motor 1, the excitation signal RS is input into the resolver and the excitation signal RS is input into the detection unit 10 from an excitation signal generation unit 17 by the switch 18.

A case when the Hall sensor 2 is used for the angle detection of the rotation axis of the motor 1 will be described with reference to FIG. 1.

As shown in FIG. 1, the angle detection apparatus 90 includes the Hall sensor 2, an AD conversion unit 3, an AD conversion unit 4, an offset correction unit 5, an offset correction unit 6, a multiplication unit 7, a multiplication unit 8, a subtracter 9, the detection unit 10, an angular velocity calculation unit 11, an integrator 12, a cosine table 13, a sine table 14, a bus 15, a microprocessor 16, the excitation signal generation unit 17, and the switch 18.

The Hall sensor 2 is mounted on the motor 1 serving as a rotating device to generate a signal SIN φ and a signal COS φ being a signal perpendicular to the signal SIN φ in accordance with a rotation angle φ of the rotation axis of the motor 1. The signal SIN φ is input into the AD conversion unit 3 and the signal COS φ is input into the AD conversion unit 4. The AD conversion unit 3 is provided between the Hall sensor 2 and the offset correction unit 5. The AD conversion unit 4 is provided between the Hall sensor 2 and the offset correction unit 6.

Adjustment of the zero point of the signal SIN φ and the signal COS φ output from the Hall sensor 2 is needed in terms of the principle of the signals. Thus, the angle detection apparatus 90 has an offset correction mechanism. The offset correction mechanism includes the offset correction unit 5, the offset correction unit 6, the microprocessor 16, a signal Sks1, a signal Sks2, a signal Sos1, and a signal Sos2. The offset correction is also inevitable in the angle detection apparatus 90 using a resolver.

The AD conversion unit 3 is provided between the Hall sensor 2 and the offset correction unit 5. The signal SIN φ is input to the AD conversion unit 3 to output a signal obtained by digital conversion of the analog signal. The AD conversion unit 4 is provided between the Hall sensor 2 and the offset correction unit 6. The signal COS φ is input to the AD con-version unit 4 to output a signal obtained by digital conversion of the analog signal. Each of the AD conversion unit 3 and the AD conversion unit 4 includes a ΔΣAD converter and a decimation filter, for example.

The offset correction unit 5 is provided between the AD conversion unit 3 and the multiplication unit 7, and the offset correction unit 6 is provided between the AD conversion unit 4 and the multiplication unit 8. The offset correction unit 5 adds an appropriate offset value to the signal output from the AD conversion unit 3. The offset correction unit 6 adds an appropriate offset value to the signal output from the AD conversion unit 4.

More specifically, the signal Sks1 output from the offset correction unit 5 and the signal Sks2 output from the offset correction unit 6 are input into the microprocessor 16 via the bus 15 for periodic monitoring. When the microprocessor 16 determines that the signal level is outside the range of a predetermined value after an offset being added to the signal Sks1 and the signal Sks2, for example, the microprocessor 16 outputs the signal Sos1 to the offset correction unit 5 via the bus 15 and the signal Sos2 to the offset correction unit 6 via the bus 15. The offset correction unit 5 and the offset correction unit 6 respectively perform an offset correction based on instructions (the signal Sos1, the signal Sos2) of the microprocessor 16.

When only the signal Sks1 is outside the range of the predetermined value, only the offset correction unit 5 performs an offset correction. When only the signal Sks2 is outside the range of the predetermined value, only the offset correction unit 6 performs an offset correction.

The multiplication unit 7 is provided between the offset correction unit 5 and the subtracter 9 and receives an offset-corrected signal output from the offset correction unit 5. The multiplication unit 7 outputs a signal obtained by multiplying the offset-corrected signal by a cosine value COS θ for a rotation angle θ, which is input by feedback from the cosine table 13 and is a result of the last operation.

The multiplication unit 8 is provided between the offset correction unit 6 and the subtracter 9 and receives an offset-corrected signal output from the offset correction unit 6. The multiplication unit 8 outputs a signal obtained by multiplying the offset-corrected signal by a sine value SIN θ for a rotation angle θ, which is input by feedback from the sine table 14 and is a result of the last operation.

The subtracter 9 is provided between the multiplication units 7, 8 and the detection unit 10. The subtracter 9 subtracts an output signal of the multiplication unit 8 from an output signal of the multiplication unit 7 to generate a signal SIN(θ-φ).

The detection unit 10 is provided between the subtracter 9 and the angular velocity calculation unit 11. The detection unit 10 outputs a product of "1", which is a fixed value input via the switch 18, and a signal SIN(θ-φ) output from the subtracter 9. That is, when the Hall sensor 2 is used, the detection unit 10 allows the signal SIN(θ-φ) to pass through.

Though not illustrated, when a resolver is used for angle detection of the rotation axis of the motor 1, the detection unit 10 samples an output of a signal Kex(t)• SIN(θ-φ) output from the subtracter 9 to perform synchronous detection synchronized with the excitation signal RS input via the switch 18. That is, a component of the excitation signal RS output from the subtracter 9 is removed and the signal SIN(θ-φ) is output from the detection unit 10.

The angular velocity calculation unit 11 is provided between the detection unit 10 and the integrator 12. The angular velocity calculation unit 11 integrates a signal output from the detection unit 10 to calculate an angular velocity V of the motor 1, which is a rotating device.

The integrator 12 integrates the angular velocity V output from the angular velocity calculation unit 11 to calculate the rotation angle φ of the motor 1, which is a rotating device.

When the signal SIN(θ-φ) output from the detection unit 10 is set as a control deviation ε, the control deviation ε becomes zero (ε=0) when the rotation angle θ, which is an output angle, and the rotation angle φ, which is an input angle, are in a state of θ=φ so that an equilibrium state is maintained. If the rotation angle φ, which is an input angle, changes to φa, the control deviation ε is no longer zero and feedback is given in such a way that the rotation angle θ, which is an output angle, becomes zero (θ=φa) in accordance with polarity of the control deviation ε. Therefore, the control deviation ε becomes zero (ε=0) to reach an equilibrium state.

As shown in FIG. 2, an angle detection apparatus 100 in the comparative example includes a resolver 30, the AD conversion unit 3, the AD conversion unit 4, the multiplication unit 7, the multiplication unit 8, the subtracter 9, the detection unit 10, the angular velocity calculation unit 11, the integrator 12, the cosine table 13, the sine table 14, and the excitation signal generation unit 17.

Compared with the angle detection apparatus 90 in the embodiment, the angle detection apparatus 100 in the comparative example does not include the offset correction unit 5, the offset correction unit 6, and the switch 18. The angle detection apparatus 100 is different in that only the resolver 30 is used for angle detection of the rotation axis of the motor 1. Considering the above, only such differences will be described.

The resolver 30 is mounted on the motor 1 serving as a rotating device. When Kex(t) serving as the excitation signal RS is input, the resolver 30 generates a signal Kex(t)• SIN φ and a signal Kex(t)• COS φ being a signal perpendicular to the signal Kex(t)• SIN φ. The signal Kex(t)• SIN φ and the signal Kex(t)• COS φ are obtained by amplitude-modulating the excitation signal RS in accordance with the rotation angle φ of the rotation axis of the motor 1 serving as a rotating device.

The signal Kex(t)• SIN φ is input into the AD conversion unit 3 and the signal Kex(t)• COS φ is input into the AD conversion unit 4. The AD conversion unit 3 is provided between the resolver 30 and the multiplication unit 7 to generate an analog-to-digital converted signal. The AD conversion unit 4 is provided between the resolver 30 and the multiplication unit 8 to generate an analog-to-digital converted signal. The subsequent operations are the same as those of the angle detection apparatus 90 when the resolver 30 is provided and thus, the description of the operations will not be repeated.

Figure 3A:
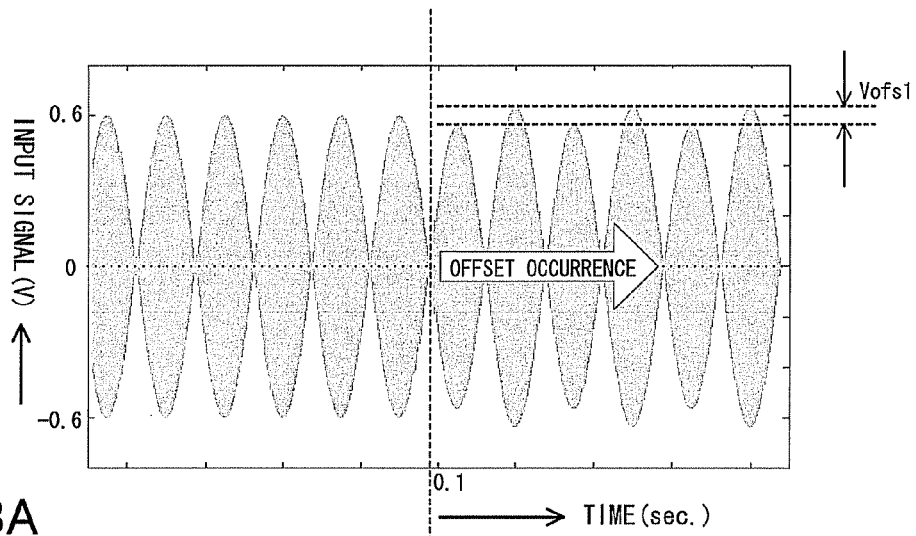
FIGS. 3A to 3C are diagrams illustrating angle detection when an offset is contained in an input according to the first embodiment.
Figure 3B:
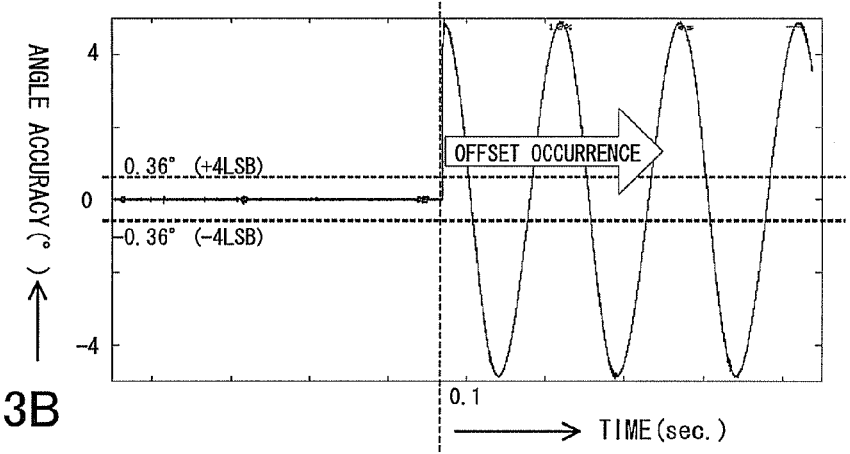
Figure 3C:
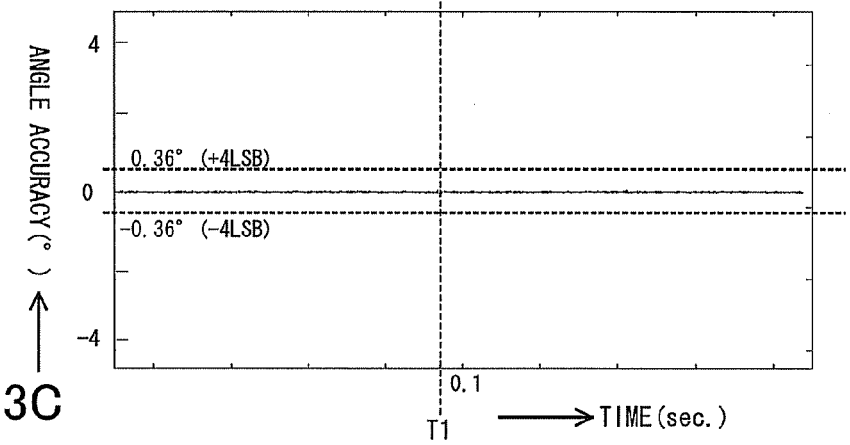

Next, the offset correction of the angle detection apparatus 90 will be described with reference to FIG. 3. FIGS. 3A to 3C are diagrams illustrating angle detection when an offset is contained in an input, and more specifically, FIG. 3A is a diagram illustrating offset generation, FIG. 3B is a diagram showing a waveform when no offset correction is performed, and FIG. 3C is a diagram showing a waveform when an offset correction is performed.

As shown in FIG. 3A, offset generation is a case when an offset of 10% (an offset of 0.12 V with respect to 1.2 V p-p) occurs with respect to the signal SIN φ and the signal COS φ output from the Hall sensor 2 at time T1.

As shown in FIG. 3B, when no offset correction is performed, while the angle accuracy is well within a range between +0.36° (+4 LSB) and −0.36° (−4 LSB) before the offset occurs, the angle accuracy is significantly reduced after time T1 due to an influence of the occurrence of the offset, resulting in a range between +5° and −5° which exceeds the range of +4 LSB and −4 LSB.

As shown in FIG. 3C, when an offset correction is performed, an offset can significantly be suppressed so that the angle accuracy can be maintained at a level of the angle accuracy before the offset occurs, even though the offset occurs after time T1.

In the angle detection apparatus in the embodiment, as described above, the microprocessor 16 periodically monitors the signal Sks1 and the signal Sks2. When the microprocessor 16 determines that the signal level is outside the range of a predetermined value after an offset being added to the signal Sks1 and the signal Sks2, the microprocessor 16 outputs the signal Sos1 to the offset correction unit 5 and outputs the signal Sos2 to the offset correction unit 6 via the bus 15. The offset correction unit 5 and the offset correction unit 6 respectively perform an offset correction based on instructions of the microprocessor 16.

Thus, even if an offset is contained in an input, the angle of the rotation axis of the motor 1 can be detected with precision. Moreover, the angle detection sensor, such as the Hall sensor 2, and the resolver 30 can properly be used as needed for angle detection and thus, the angle detection apparatus 90 can be applied to various uses. When the angle is detected only by the angle detection sensor such as the Hall sensor 2, the excitation signal generation unit 17 and the expensive resolver 30 are not needed, and accordingly, the system cost of the angle detection apparatus 90 can significantly be reduced.

Figure 4:
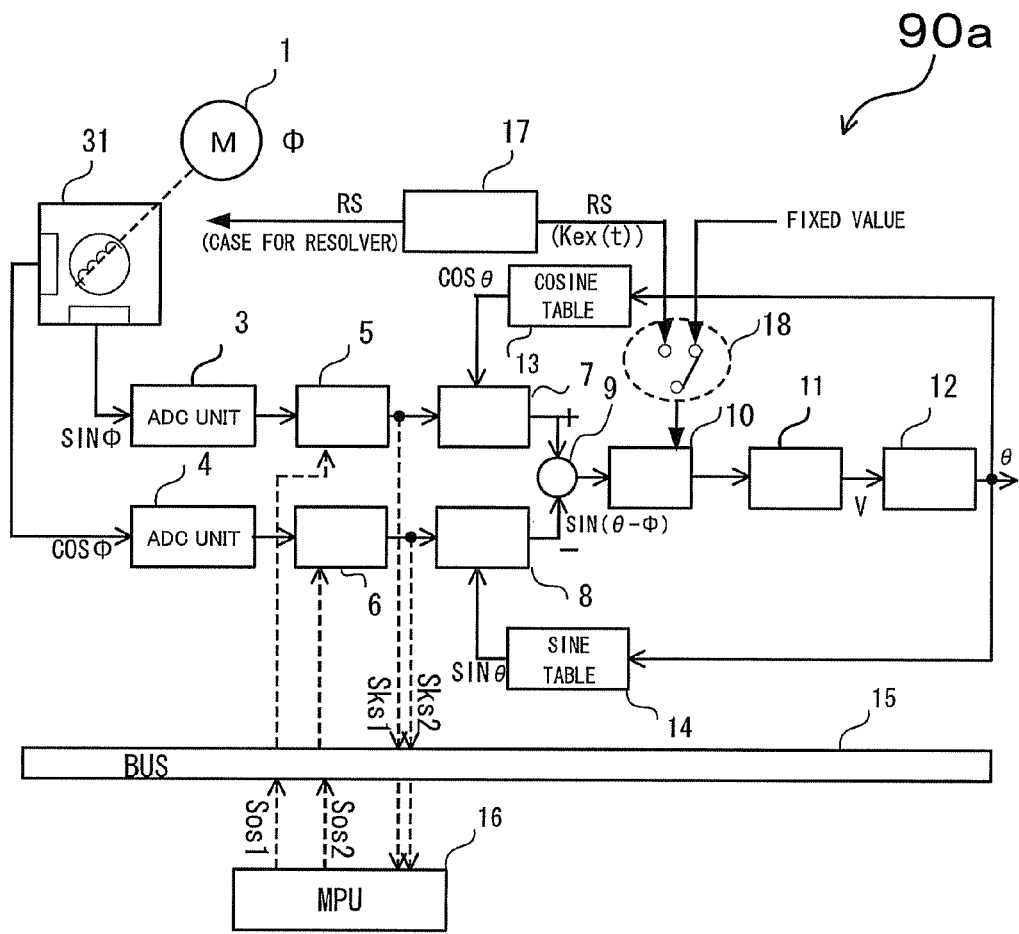
FIG. 4 is a block diagram showing the angle detection apparatus according to a modification.

In the embodiment, the angle detection apparatus 90 is configured to be able to support a sensor that detects a signal converted into a signal SIN $\phi$ or a signal COS $\phi$ in accordance with the rotation angle $\phi$ of the motor 1, and the Hall sensor 2 is used for the angle detection. However, the embodiment is not necessarily limited to such configuration using the Hall sensor 2. As shown in an angle detection apparatus 90a shown in FIG. 4, for example, an MR sensor 31 may be used instead of the Hall sensor 2. Alternatively, a Hall IC may be used.

Figure 5:
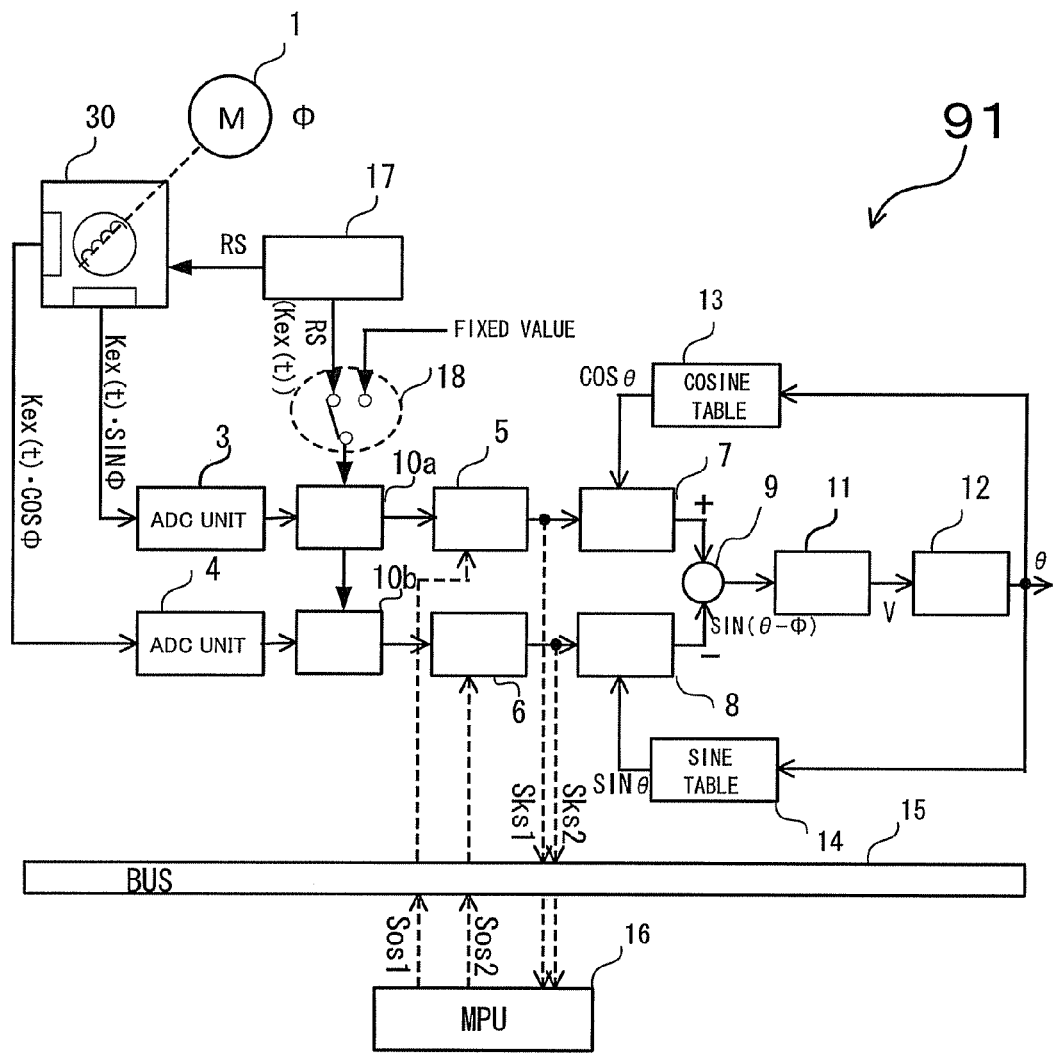
FIG. 5 is a block diagram showing the angle detection apparatus according to a second embodiment.

An angle detection apparatus according to a second embodiment will be described with reference to drawings. FIG. 5 is a block diagram showing the angle detection apparatus. In the embodiment, an offset is corrected after detection processing.

Hereinafter, the same reference numerals denote the same components and a description of such components will not be repeated to describe only different components.

In an angle detection apparatus 91, when a Hall sensor is used as an angle detection unit for angle detection of the rotation axis of the motor 1 serving as a rotating device, a fixed value is input into a detection unit 10a and a detection unit 10b by the switch 18. When the Hall sensor is used, the excitation signal RS is not needed. When the resolver 30 is used as an angle detection unit for angle detection of the rotation axis of the motor 1, the excitation signal RS is input into the resolver 30 and the excitation signal RS is input from the excitation signal generation unit 17 into the detection unit 10a and the detection unit 10b by the switch 18.

A case when the resolver 30 is used for angle detection of the rotation axis of the motor 1 will be described with reference to FIG. 5.

As shown in FIG. 5, the angle detection apparatus 91 includes the resolver 30, the AD conversion unit 3, the AD conversion unit 4, the detection unit 10a, the detection unit 10b, the offset correction unit 5, the offset correction unit 6, the multiplication unit 7, the multiplication unit 8, the subtracter 9, the angular velocity calculation unit 11, the integrator 12, the cosine table 13, the sine table 14, the bus 15, the microprocessor 16, the excitation signal generation unit 17, and the switch 18.

The resolver 30 is mounted on the motor 1 serving as a rotating device. When Kex(t) serving as the excitation signal RS is input, the resolver 30 generates a signal Kex(t)• SIN $\phi$ and a signal Kex(t)• COS $\phi$ being a signal perpendicular to the signal Kex(t)• SIN $\phi$. The signal Kex(t)• SIN $\phi$ and the signal Kex(t)• COS $\phi$ are obtained by amplitude-modulating the excitation signal RS in accordance with the rotation angle $\phi$ of the rotation axis of the motor 1 serving as a rotating device.

The signal Kex(t)• SIN $\phi$ is input into the AD conversion unit 3 and the signal Kex(t)• COS $\phi$ is input into the AD conversion unit 4. The AD conversion unit 3 is provided between the resolver 30 and the detection unit 10a to generate an analog-to-digital converted signal. The AD conversion unit 4 is provided between the resolver 30 and the detection unit 10b to generate an analog-to-digital converted signal.

The detection unit 10a is provided between the AD conversion unit 3 and the offset correction unit 5. The detection unit 10a samples an output of a signal output from the AD conversion unit 3 to perform synchronous detection synchronized with the excitation signal RS input via the switch 18. The detection unit 10b is provided between the AD conversion unit 4 and the offset correction unit 6. The detection unit 10b samples an output of a signal output from the AD conversion unit 4 to perform synchronous detection synchronized with the excitation signal RS input via the switch 18.

The offset correction unit 5 is provided between the detection unit 10a and the multiplication unit 7. The offset correction unit 5 adds an appropriate offset value to the signal output from the detection unit 10a. The offset correction unit 6 is provided between the detection unit 10b and the multiplication unit 8. The offset correction unit 6 adds an appropriate offset value to the signal output from the detection unit 10b. The offset correction of the offset correction unit 5 and the offset correction unit 6 is made in the same manner as that of the first embodiment.

When the offset correction of a signal from a detection unit is made as in the embodiment, the offset correction can be made properly even if an offset enters the angle of the motor 1 before amplitude modulation by the resolver 30, for example. Similarly, the offset correction can be made properly in the angle detection apparatus 91 with an angle detection sensor.

As described above, in the angle detection apparatus according to the embodiment, a signal output from the AD conversion unit 3 is input into the detection unit 10a, and the signal output from the detection unit 10a is input into the offset correction unit 5. A signal output from the AD conversion unit 4 is input into the detection unit 10b, and the signal output from the detection unit 10b is input into the offset correction unit 6. The offset correction unit 5 and the offset correction unit 6 respectively perform an offset correction based on instructions of the microprocessor 16.

Thus, even if an offset is contained in an input, the angle of the rotation axis of the motor 1 can be detected with precision. Moreover, the angle detection sensor, such as the Hall sensor 2, and the resolver 30 can properly be used as needed for angle detection and thus, the angle detection apparatus 91 can be applied to various uses. When the angle is detected only by the angle detection sensor such as the Hall sensor 2, the excitation signal generation unit 17 and the expensive resolver 30 are not needed, and accordingly, the system cost of the angle detection apparatus 91 can significantly be reduced.

Figure 6:
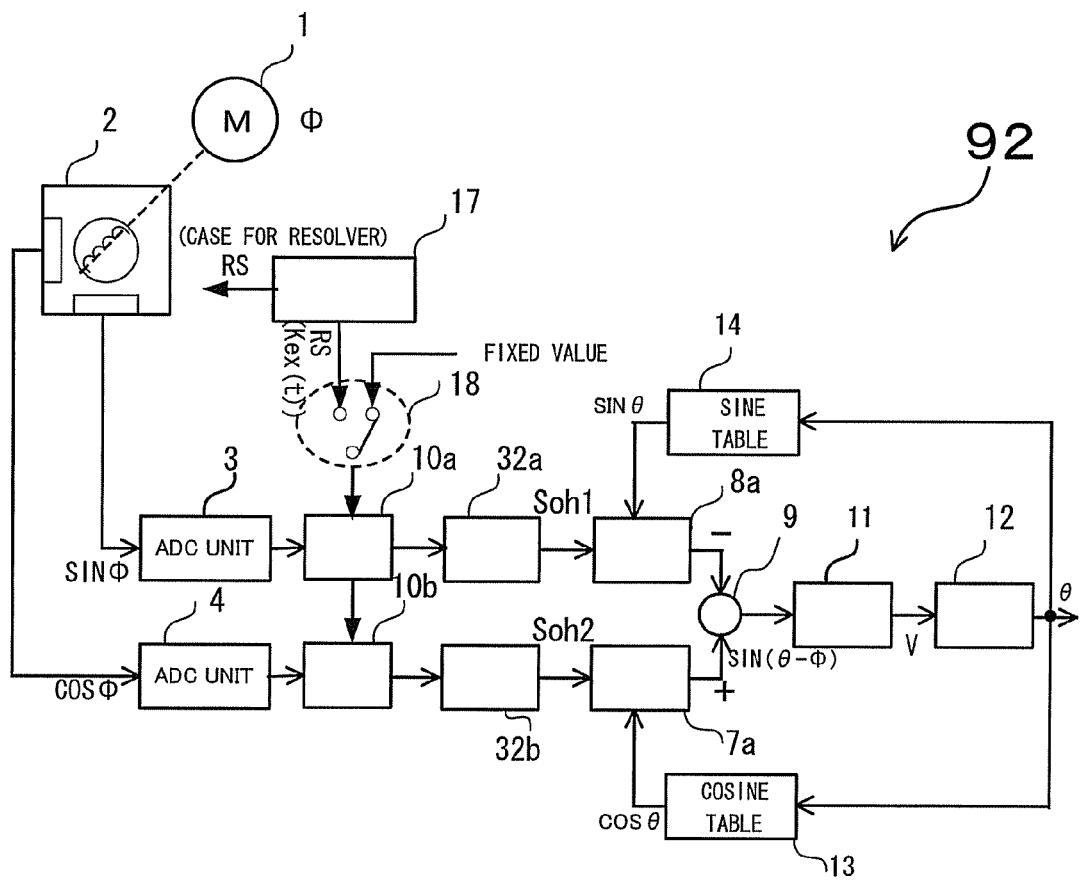
FIG. 6 is a block diagram showing the angle detection apparatus according to a third embodiment.

An angle detection apparatus according to a third embodiment will be described with reference to a drawing. FIG. 6 is a circuit diagram showing the angle detection apparatus. In the embodiment, a signal correction is made by detecting a rate of change after detection processing.

In an angle detection apparatus 92, as shown in FIG. 6, when the Hall sensor 2 is used as an angle detection unit for angle detection of the rotation axis of the motor 1 serving as a rotating device, a fixed value is input into the detection unit 10a and the detection unit 10b by the switch 18. When the Hall sensor 2 is used, the excitation signal RS is not needed. When a resolver is used as an angle detection unit for angle detection of the rotation axis of the motor 1, the excitation signal RS is input into the resolver and the excitation signal RS is input from the excitation signal generation unit 17 into the detection unit 10a and the detection unit 10b by the switch 18.

A case when the Hall sensor 2 is used for angle detection of the rotation axis of the motor 1 will be described with reference to FIG. 6.

As shown in FIG. 6, the angle detection apparatus 92 includes the Hall sensor 2, the AD conversion unit 3, the AD conversion unit 4, the detection unit 10a, the detection unit 10b, a change rate detection unit 32a, a change rate detection unit 32b, a multiplication unit 7a, a multiplication unit 8a, the subtracter 9, the angular velocity calculation unit 11, the integrator 12, the cosine table 13, the sine table 14, the excitation signal generation unit 17, and the switch 18. The angle detection apparatus 92 replaces the offset correction unit 5 in the second embodiment with the change rate detection unit 32a, replaces the offset correction unit 6 in the second embodiment with the change rate detection unit 32b, and does not use the bus 15 and the microprocessor 16. Thus, only differences will be described hereafter.

The change rate detection unit 32a is provided between the detection unit 10a and the multiplication unit 8a. The change rate detection unit 32a receives a signal SIN φ output from the detection unit 10a to calculate the rate of change of the signal SIN φ. Calculating the rate of change is to generate a signal COS φ by differentiating the signal SIN φ output from the detection unit 10a. When the signal SIN φ output from the detection unit 10a contains an offset component off1, the change rate detection unit 32a differentiates (SIN φ+off1) and outputs only the COS φ component because the term of the offset component off1 disappears. That is, the change rate detection unit 32a generates a signal Soh1, which is the offset-corrected signal COS φ.

The change rate detection unit 32b is provided between the detection unit 10b and the multiplication unit 7a. The change rate detection unit 32b receives a signal COS φ output from the detection unit 10b to calculate the rate of change of the signal COS φ. Calcurating the rate of change is to generate a signal −SIN φ by differentiating the signal COS φ output from the detection unit 10b. When the signal COS φ output from the detection unit 10b contains an offset component off2, the change rate detection unit 32b differentiates (COS φ+off2) and outputs only the −SIN φ component because the term of the offset component off2 disappears. That is, the change rate detection unit 32b generates a signal Soh2, which is the offset-corrected signal −SIN φ.

The multiplication unit 8a is provided between the change rate detection unit 32a and the subtracter 9 and receives the offset-corrected signal Soh1 output from the change rate detection unit 32a. The multiplication unit 8a outputs a signal obtained by multiplying the offset-corrected signal Soh1 by a sine value SIN θ for the rotation angle θ, which is input by feedback from the sine table 14 and is a result of the last operation.

The multiplication unit 7a is provided between the change rate detection unit 32b and the subtracter 9 and receives the offset-corrected signal Soh2 output from the change rate detection unit 32b. The multiplication unit 7a outputs a signal obtained by multiplying the offset-corrected signal Soh2 by a cosine value COS θ for the rotation angle θ, which is input by feedback from the cosine table 13 and is a result of the last operation.

The subtracter 9 is provided between the multiplication unit 7a and the multiplication unit 8a, and the angular velocity calculation unit 11. The subtracter 9 subtracts an output signal of the multiplication unit 8a from an output signal of the multiplication unit 7a to generate a signal SIN(θ-φ).

As described above, in the angle detection apparatus according to the embodiment, a signal output from the AD conversion unit 3 is input into the detection unit 10a, and the signal output from the detection unit 10a is input into the change rate detection unit 32a. A signal output from the AD conversion unit 4 is input into the detection unit 10b, and the signal output from the detection unit 10b is input into the change rate detection unit 32b. The change rate detection unit 32a and the change rate detection unit 32b generate offset-corrected signals by differentiating respective input signals to eliminate the offset components.

Thus, even if the rate of change of an input signal changes, the angle of the rotation axis of the motor 1 can be detected with precision. Moreover, the angle detection sensor, such as the Hall sensor 2, and the resolver 30 can properly be used as need for angle detection and thus, the angle detection apparatus 92 can be applied to various uses. When the angle is detected only by the angle detection sensor such as the Hall sensor 2, the excitation signal generation unit 17 and the expensive resolver 30 are not needed, and accordingly, the system cost of the angle detection apparatus 92 can significantly be reduced.

In the embodiments, units ranging from the AD conversion unit to the integrator that outputs the rotation angle θ are configured separately, but the embodiments are not limited to such a configuration. These units may be configured by a dedicated processor such as a DSP, for example. An angle detection apparatus and a microprocessor may be formed on the same semiconductor integrated circuit chip. Alternatively, an angle detection apparatus and a microprocessor may be mounted in the same package.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An angle detection apparatus to detect an angle of a rotation axis of a rotating device to generate a first signal and a second signal perpendicular to the first signal using an angle detection unit, comprising:

a first analog-to digital (AD) conversion unit to receive the first signal, the first analog-to-digital (AD) conversion unit to perform an analog-to-digital conversion of the first signal;

a second analog-to digital (AD) conversion unit to receive the second signal, the second analog-to digital (AD) conversion unit to perform an analog-to-digital conversion of the second signal;

a first offset correction unit to receive a third signal output from the first analog-to digital (AD) conversion unit, the first offset correction unit to perform an offset correction of the third signal when the third signal is outside a range of a predetermined value; and a second offset correction unit to receive a fourth signal output from the second analog-to digital (AD) conversion unit, the second offset correction unit to perform the offset correction of the fourth signal when the fourth signal is outside the range of the predetermined value.

2. The angle detection apparatus according to claim 1, wherein the angle detection unit is a resolver or an angle detection sensor, and when the resolver is used, the resolver receives an excitation signal and generates a signal obtained by amplitude-modulating the excitation signal in accordance with a rotation angle of a rotation axis of the rotating device.

3. The angle detection apparatus according to claim 2, wherein the angle detection sensor is a Hall sensor, a Hall IC, or magnetoresistive (MR) sensor.

4. The angle detection apparatus according to claim 1, wherein the offset correction is performed based on instructions from a microprocessor or a CPU.

5. The angle detection apparatus according to claim 4, wherein the instructions are issued via a bus.

6. The angle detection apparatus according to claim 1, wherein each of the first and the second conversion units includes a $\Delta\Sigma AD$ converter and a decimation filter.

7. An angle detection apparatus to detect an angle of a rotation axis of a rotating device using a resolver or an angle detection sensor, and having an excitation signal generation unit to output an excitation signal to the resolver when the resolver is mounted on the rotating device, comprising:
 a first analog-to digital (AD) conversion unit to receive a first signal output from the resolver or the angle detection sensor mounted on the rotating device, the first analog-to digital (AD) conversion unit to perform an analog-to-digital conversion of the first signal;
 a second analog-to digital (AD) conversion unit to receive a second signal being perpendicular to the first signal output from the resolver or the angle detection sensor mounted on the rotating device, the second analog-to digital (AD) conversion unit to perform the analog-to-digital conversion of the second signal;
 a first offset correction unit to receive a third signal output from the first analog-to digital (AD) conversion unit, the first offset correction unit to perform an offset correction of the third signal when the third signal is outside a range of a predetermined value;
 a second offset correction unit to receive a fourth signal output from the second analog-to digital (AD) conversion unit, the second offset correction unit to perform the offset correction of the fourth signal when the fourth signal is outside the range of the predetermined value;
 a switch to select one of the excitation signal and a fixed value; and
 a detection unit to perform synchronous detection synchronized with the excitation signal input via the switch so as to output a signal obtained by eliminating a component of the excitation signal contained in an input signal when the resolver is mounted on the rotating device, the detection unit to output a product of the fixed value input via the switch and the input signal, when the angle detection sensor is mounted on the rotating device.

8. The angle detection apparatus according to claim 7, wherein the offset correction is performed based on instructions from a microprocessor or a CPU.

9. The angle detection apparatus according to claim 8, wherein the instructions are issued via a bus.

10. The angle detection apparatus according to claim 7, wherein the angle detection sensor is a Hall sensor, a Hall IC, or magnetoresistive (MR) sensor.

11. The angle detection apparatus according to claim 7, wherein each of the first and the second conversion units includes a $\Delta\Sigma AD$ converter and a decimation filter.

12. An angle detection apparatus to detect an angle of a rotation axis of a rotating device using a resolver or an angle detection sensor, and having an excitation signal generation unit to output an excitation signal to the resolver when the resolver is mounted on the rotating device, comprising:
 a first analog-to digital (AD) conversion unit to receive a first signal output from the resolver or the angle detection sensor mounted on the rotating device, the first analog-to digital (AD) conversion unit to perform an analog-to-digital conversion of the first signal;
 a second analog-to digital (AD) conversion unit to receive a second signal being perpendicular to the first signal output from the resolver or the angle detection sensor mounted on the rotating device, the second analog-to digital (AD) conversion unit to perform the analog-to-digital conversion of the second signal;
 a switch to select one of the excitation signal and a fixed value;
 a first detection unit to perform synchronous detection synchronized with the excitation signal input via the switch so as to output a signal obtained by eliminating a component of the excitation signal contained in a third signal output from the first analog-to digital (AD) conversion unit when the resolver is mounted on the rotating device, the first detection unit to output a product of the fixed value input via the switch and the third signal when the angle detection sensor is mounted on the rotating device;
 a second detection unit to perform the synchronous detection synchronized with the excitation signal input via the switch so as to output the signal obtained by eliminating the component of the excitation signal contained in a fourth signal output from the second analog-to digital (AD) conversion unit when the resolver is mounted on the rotating device, the second detection unit to output a product of the fixed value input via the switch and the fourth signal when the angle detection sensor is mounted on the rotating device;
 a first offset correction unit to receive a fifth signal output from the first detection unit, the first offset correction unit to perform an offset correction of the fifth signal when the fifth signal is outside a range of a predetermined value; and
 a second offset correction unit to receive a sixth signal output from the second detection unit, the second offset correction unit to perform the offset correction of the sixth signal when the sixth signal is outside the range of the predetermined value.

13. The angle detection apparatus according to claim 12, wherein the offset correction is performed based on instructions from a microprocessor or a CPU.

14. The angle detection apparatus according to claim 13, wherein the instructions are issued via a bus.

15. The angle detection apparatus according to claim 12, wherein the angle detection sensor is a Hall sensor, a Hall IC, or magnetoresistive (MR) sensor.

16. The angle detection apparatus according to claim 12, wherein each of the first and the second conversion units includes a $\Delta\Sigma AD$ converter and a decimation filter.

\* \* \* \* \*